United States Patent
Batinovich

(10) Patent No.: US 7,104,804 B2
(45) Date of Patent: Sep. 12, 2006

(54) METHOD AND APPARATUS FOR MEMORY MODULE CIRCUIT INTERCONNECTION

(75) Inventor: Victor Batinovich, Sunnyvale, CA (US)

(73) Assignee: Advanced Interconnect Solutions, San Jose, CA (US)

( * ) Notice: Subject to any disclaimer, the term of this patent is extended or adjusted under 35 U.S.C. 154(b) by 0 days.

(21) Appl. No.: 09/915,708

(22) Filed: Jul. 25, 2001

(65) Prior Publication Data

US 2002/0015340 A1 Feb. 7, 2002

Related U.S. Application Data

(63) Continuation-in-part of application No. 09/625,693, filed on Jul. 6, 2000, which is a continuation-in-part of application No. 09/609,626, filed on Jul. 3, 2000.

(51) Int. Cl.
*H01R 12/00* (2006.01)

(52) U.S. Cl. ........................................ 439/71
(58) Field of Classification Search ............ 439/66, 439/71, 91, 591, 67; 361/783, 790, 809
See application file for complete search history.

(56) References Cited

U.S. PATENT DOCUMENTS 5,531,022 A * 7/1996 Beaman et al. ............ 29/850
5,810,607 A * 9/1998 Shih et al. .................. 439/66
6,097,609 A * 8/2000 Kabadi ........................ 361/760

OTHER PUBLICATIONS

U.S. patent application Ser. No. 09/625,693, Ong, pending.
U.S. patent application Ser. No. 09/609,626, Ong, pending.

* cited by examiner

*Primary Examiner*—Jean Duverne
(74) *Attorney, Agent, or Firm*—Thelen Reid & Priest LLP; David B. Ritchie

(57) ABSTRACT

An IC package for mounting to a surface of a device board includes a first IC having a first surface supporting a first plurality of conductive leads extending orthogonally from the first surface, a second IC having a second surface supporting a second plurality of conductive leads extending orthogonally from the second surface, the first and second ICs spaced apart in parallel with the first and second surfaces facing, and an interposer trace board parallel to the first and second ICs and positioned between the first and second ICs, the trace board having conducting metal traces on a non-conductive sheet material, the traces accessible from both sides of the trace board, being exposed at selected regions through the non-conductive sheet. The package is characterized in that the conductive traces contact individual ones of the first and second pluralities of conductive leads, providing conductive signal paths from the first and second ICs between the ICs and leading to edges of the IC package.

19 Claims, 10 Drawing Sheets

2X Memory Chip (Stacked Wide Bond)

Memory Chip (Wire Bond)

BGA Chip Package (Wire Bond)

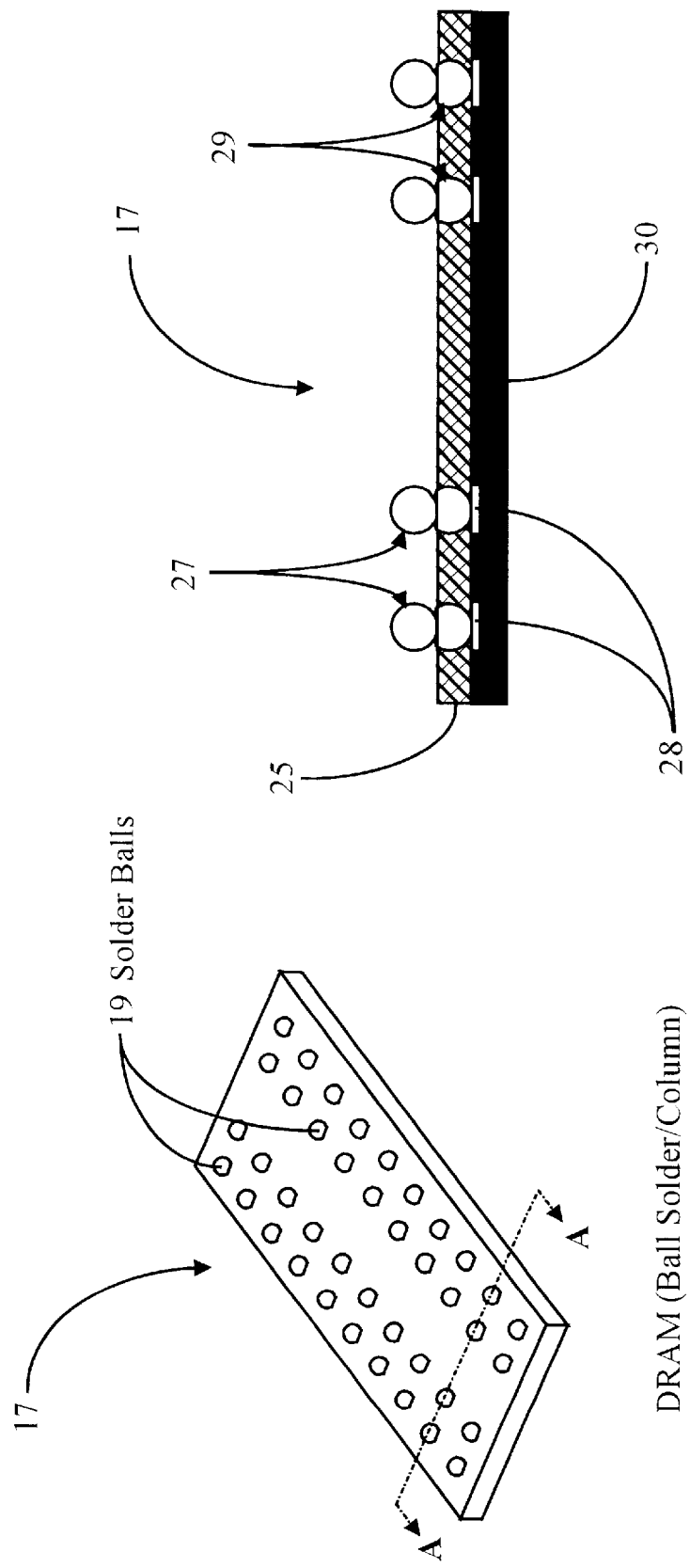

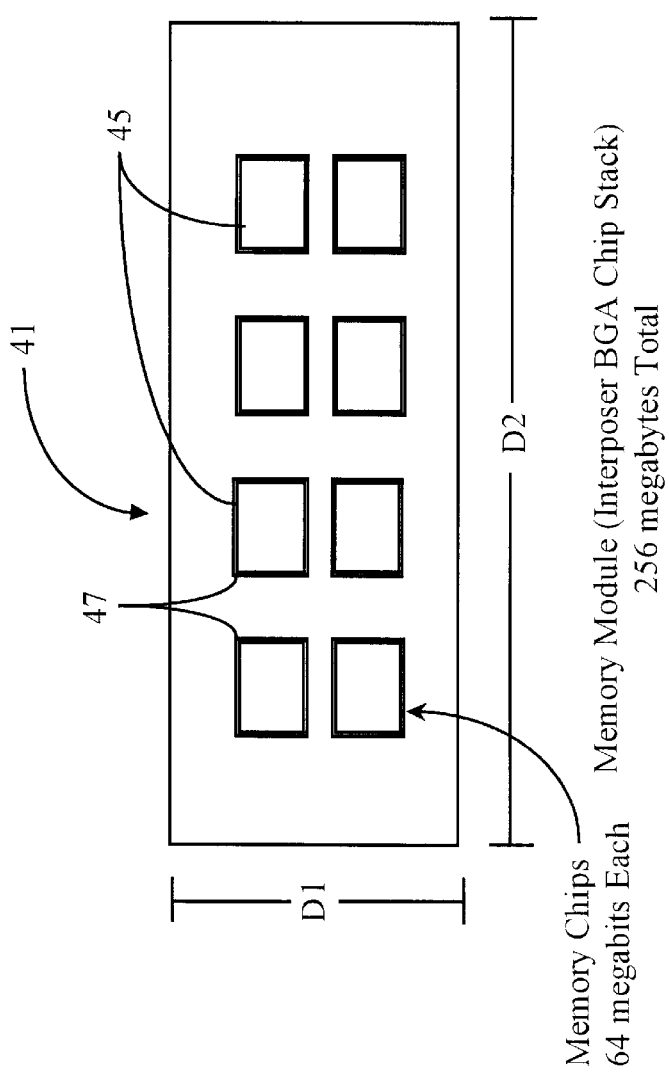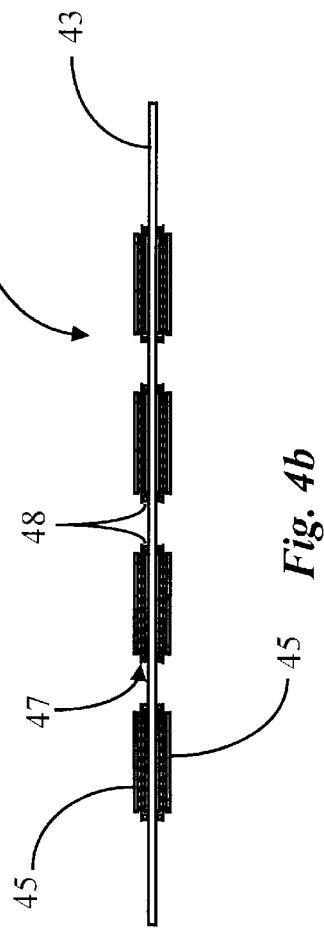
Fig. 4a
Fig. 4b

METHOD AND APPARATUS FOR MEMORY MODULE CIRCUIT INTERCONNECTION

CROSS-REFERENCE TO RELATED DOCUMENTS

The present application is a continuation-in-part (CIP) of a pending patent application bearing the Ser. No. 09/625,693, entitled "Method and Apparatus for Protecting and Strengthening Electrical Contact Interfaces", which is itself a CIP of a co-pending application bearing the Ser. No. 09/609,626, filed Jul. 3, 2000 entitled "Method and Apparatus for Applying a Protective Over-coating to a Ball-Grid-Array (BGA) Structure", both of which are incorporated herein in their entirety by reference.

FIELD OF THE INVENTION

The present invention is in the field of low-profile electronic circuit devices and pertains in particular to methods and apparatus for electronic circuit interconnection and mounting of chip-scale circuit devices in a high-density memory module.

BACKGROUND OF THE INVENTION

The field of integrated circuit interconnection and packaging is one of the most rapidly evolving technologies associated with semiconductor manufacturing. As demand for devices that are smaller and more powerful continues to increase, pressure is put on manufacturers to develop better and more efficient ways to assemble and package IC products. Much work in this field has been focused on peripheral memory-chip packages with wire bond chip-to-package interconnects, and mounting and connecting such devices onto PCB modules in such a way that storage capacity and function speed of the memory module is increased while vertical height and footprint of mounted devices is kept to a minimum. Such memory devices often utilize devices with Thin Small Outline Package (TSOP) pin configurations, utilizing various well known chip-flipping and stacking technologies. Recent solutions utilizing chip-size package (CSP) devices have incorporated surface mount area solder ball technology such as Ball Grid Array (BGA) and other wafer-level packaging schemes known to the inventor. Such solder ball interconnection methods eliminate the need for outer-edge pad arrangements such as those used for typical TSOP memory chips, for example, and strengthen and protect the connection leads from damage during handling which can hinder or eliminate signal propagation. Also, connection leads can be fanned out in an area array in much greater numbers, increasing available I/O leads, utilizing an otherwise unused area under the chip. Many other clear and important advantages over other mainstream interconnect technologies such as Fine-Pitch-Technology (FTP), and Pin-Grid-Array (PGA), driving much of the focus in development in such CSP area-array interconnect schemes.

In enhanced CSP technology such as described above, wafers or substrates are typically protected with a non-conductive material such as a polyamide layer, for example. The die pads are exposed through the protective layer by means of chemical etching, or by other known methods. The protective layer is intended to protect the circuits from contaminants and damage. One problem with prior-art protective wafer-level coatings such as described is that such coatings are ultra-thin and do not offer much mechanical protection to the die pads themselves, nor to the connection points between solder balls in the die pads.

There are several enhancements known to the inventor for techniques utilized in wafer-level packaging for CSP devices of BGA technology. In one of these enhancements, a process involving application of an additional protective polymer coating is applied at wafer level to the connection side of the wafer. The process is taught in the patent application Ser. No. 09/609,626, entitled "Method and Apparatus for Applying a Protective Over-coating to a Ball-Grid-Array (BGA) Structure", which is referenced above as a priority document.

A method and apparatus in the above-referenced patent application comprises an upper plate having at least one injection port forming the upper chamber wall, and a lower plate having at least one vacuum port forming the lower chamber wall of the vacuum-application and coating apparatus when assembled. A compliant layer of material is provided on the chamber-side surface of the upper plate and a sealing mechanism for enabling a vacuum seal is also provided. At least one assembly to be coated is placed on the chamber surface of the lower plate during assembly of the vacuum-application and coating apparatus, which forms a vacuum chamber. The ball-grid-array assemblies held in the chamber are protected from receiving any coating on the upper portions of connected solder balls during processing by virtue of intimate contact between the solder balls and the compliant layer of material.

The above-described process provides protection for die-pads and solder connections of BGA-type ICs. The inventor also has knowledge of methods for building or extending contact surfaces of a BGA assembly to the surface of the package through protective coatings and then back grinding the assembly in order to reduce weight and thermal mass of the chip package. One such method is photoresist polymerization where solder columns are formed prior to application of the photosensitive polymer coating.

The process of chip stacking, as described earlier for TSOP memory chips, is an emerging technology involving integration of two, or possibly more, chip devices together on a single board. Chip stacking can greatly increase the memory capacity of a memory module, for example, without unduly increasing the footprint of the device. Types of stacked chip packages include Chip Scale Packages (CSP), True Chip Size Packages (TCSP) and True Die Size Packages (TDSP). TCSP and TDSP packages include devices such as Dynamic Random Access Memory (DRAM), flash memory as well as many others, typically employed in products such as hand-held computers and other small electronic devices for communications, and elsewhere where density and low profile is of importance. Assembling CSP devices using BGA technology already allows for a smaller form factor for ICs than is available in competing technologies such as wire bond methods, and by utilizing chip stacking techniques in this technology substantial increases in price-performance and capacity and reliability may be realized. The contributions described above with respect to mentioned processes known to the inventor provide considerable strengthening and improved signal propagation than do known prior-art methods.

In general manufacturing of memory-type devices, it is desirable to increase memory capacity of the device while minimizing the bulk and footprint of the memory module of the host device. Modules built with wire bond techniques are very difficult to economically increase capacity in such a manner. It is known that CSP/BGA devices provide smaller form factor than other mainstream technologies. It has occurred to the inventors that it would be desirable to stack chips on a single board so as to multiply the memory power available to the resulting module of equivalent prior-art modules. However, a method and apparatus must be conceived in order to provide economical assembly and packaging while keeping the overall size profile of the memory packages small. It is to this goal that the methods and apparatus of the present invention more particularly pertain.

What is therefore clearly needed is a method and apparatus for enabling a chip integration technique to be applied to device boards wherein memory, and in some cases, other functional ICs may be integrated and added to a device board without requiring larger X, Y (footprint) or, in many cases Z dimension increases in existing form-factors. Such a method and apparatus would allow devices to be manufactured or retrofitted with a multiple of added memory devices without utilizing more physical space.

SUMMARY OF THE INVENTION

In a preferred embodiment of the present invention an IC package for mounting to a surface of a device board is provided, comprising a first IC having a first surface supporting a first plurality of conductive leads extending orthogonally from the first surface, a second IC having a second surface supporting a second plurality of conductive leads extending orthogonally from the second surface, the first and second ICs spaced apart in parallel with the first and second surfaces facing, and an interposer trace board parallel to the first and second ICs and positioned between the first and second ICs, the trace board having conducting metal traces on a non-conductive sheet material, the traces accessible from both sides of the trace board, being exposed at selected regions through the non-conductive sheet. The package is characterized in that the conductive traces contact individual ones of the first and second pluralities of conductive leads, providing conductive signal paths from the first and second ICs between the ICs and leading to edges of the IC package.

In a preferred embodiment the ICs are memory chips and the device board is a memory board. Also in a preferred embodiment conductive leads of the first and second ICs in the package are solder balls. In some cases the solder balls are supported by solder columns extending through a non-conductive polymer layer on individual ICs. The conductive metal traces may be formed in a copper foil joined to the non-conductive sheet material by adhesive, or may be formed in a metal material deposited on the non-conductive sheet using a metal deposition technology, which may be one of spin-on, sputtering, or evaporation technology.

In another aspect of the invention a memory module for providing memory resources to a computerized appliance is provided, comprising a printed circuit board (PCB) having at least one location for mounting an IC module, at least one IC module mounted to the circuit board, the module comprising a first IC having a first surface supporting a first plurality of conductive leads extending orthogonally from the first surface, a second IC having a second surface supporting a second plurality of conductive leads extending orthogonally from the second surface, the first and second ICs spaced apart in parallel with the first and second surfaces facing, and an interposer trace board parallel to the first and second ICs and positioned between the first and second ICs, the trace board having conducting metal traces on a non-conductive sheet material, the traces accessible from both sides of the trace board, being exposed at selected regions through the non-conductive sheet, characterized in that the conductive traces contact individual ones of the first and second pluralities of conductive leads, providing conductive signal paths from the first and second ICs between the ICs, and leading to edges of the IC package, and a bus-bar facility positioned along at least one edge of the IC module, providing conductive paths from the traces of the interposer board to selected regions of the PCB.

In one embodiment of the memory the ICs are memory chips. Also in a preferred embodiment the conductive leads of the first and second ICs are solder balls. The solder balls in a preferred embodiment are supported by solder columns extending through a non-conductive polymer layer on the individual ICs.

In some embodiments, regarding the interposer board, the conductive metal traces are formed in a copper foil joined to the non-conductive sheet material by adhesive. In other embodiments, regarding the interposer board, the conductive metal traces are formed in a metal material deposited on the non-conductive sheet using a metal-deposition technology. The deposition technology may be one of a spin-on, sputtering, or evaporation technology. In some embodiments there are a plurality of IC packages mounted to both sides of the circuit board of the module.

In yet another embodiment of the invention an interposing contact element for providing conductive and nonconductive interface between opposing leads of two ICs stacked in a packaged IC assembly is provided, comprising a non-conductive sheet, and metal contact pads and traces formed on the non-conductive sheet, including openings through the non-conductive sheet to expose regions of conductive contact pads or traces. This interposer board is characterized in that the contact pads and traces are placed on the nonconductive sheet to match a pattern of the opposing leads of the two ICs.

In some embodiments the conductive traces and contact pads are formed from a copper foil applied to the non-conductive sheet by an adhesive, while in other the metal contact pads and traces are formed in a metallic film layer deposited on the interfacing material using one of a deposition, spin-on, or sputtering technology. The non-conductive sheet, in some preferred embodiments, is formed from a BT resin.

In embodiments of the present invention taught in enabling detail below, for the first time a memory module is provided with significantly increased volumetric memory density than has been previously available in the art.

BRIEF DESCRIPTIONS OF THE DRAWING FIGURES

FIG. 2a is a perspective view of a DRAM memory chip assembled using a ball/column lead technology according to an embodiment of the present invention.

FIG. 2b is a cross section view of the DRAM memory chip of FIG. 2a taken along section line A—A of FIG. 2a.

FIG. 3b is a side elevation view of the device board of FIG. 3a.

FIG. 4a is a plan view of a device board supporting an array of mounted DRAM memory chip stacks according to an embodiment of the present invention.

FIG. 4b is a side view of the device board of FIG. 3a.

DESCRIPTION OF THE PREFERRED EMBODIMENTS

According to an embodiment of the present invention a method and apparatus is provided for enabling memory density increases to existing or newly manufactured memory-dependant appliances or other types of modules, utilizing a method for economical chip stacking using CSP and BGA technology, and a novel interconnect unit termed an interposer by the inventor.

Referring now to the background section, general BGA assembly techniques are superior to other wire bond methods such as, for example, FPT or PGA technologies. For example, wire bond methods produce chip packages that are considerably larger in X, Y, and Z dimensioning than are BGA type packages known to the inventor.

Figures 1A, 1B:
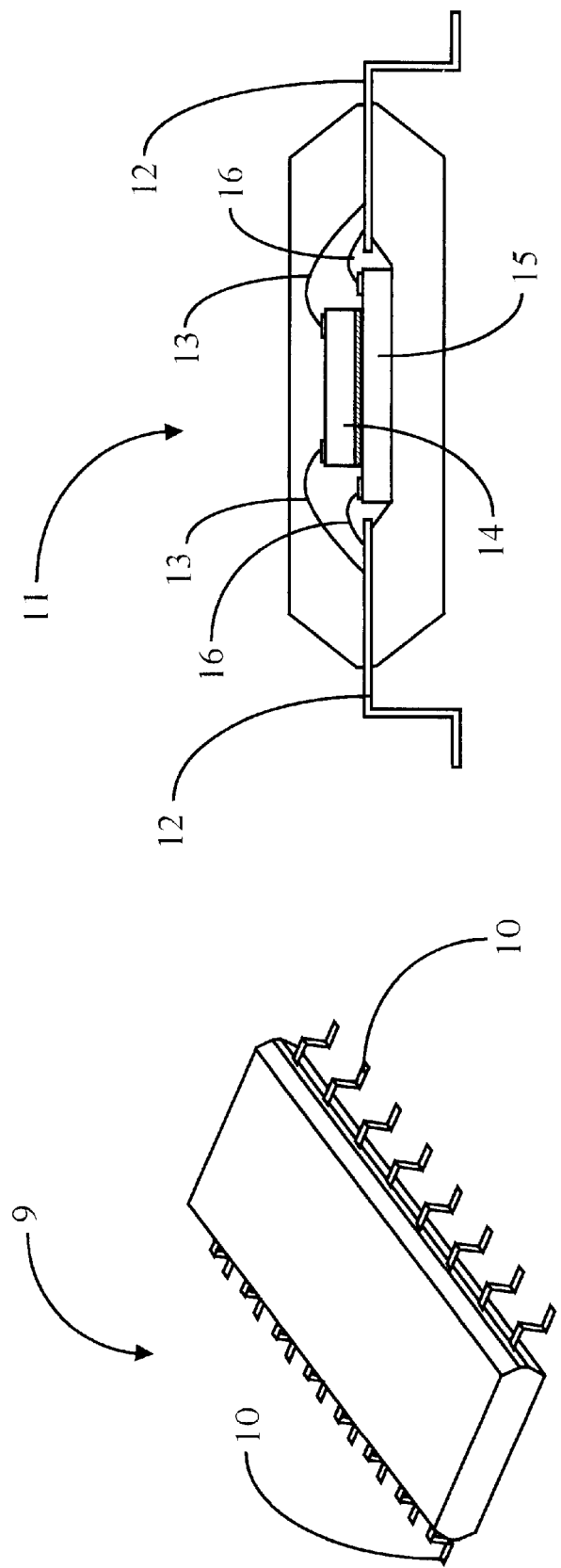
FIG. 1a is a perspective view of a wire bonded single memory chip package according to prior art.
FIG. 1b is a cross section view of a memory chip package in the prior art containing two wire bonded memory chips forming a chip stack.

FIG. 1a is a perspective view of a wire bonded single memory chip package according to prior art. Chip package 9 in this embodiment is assembled according to known wire bonding manufacturing techniques, and in this embodiment contains a single memory DRAM utilizing a standard TSOP circuit pad arrangement. A plurality of leads 10, illustrated as extending from each long edge of the rectangular-shaped chip package 9, are formed during manufacture and serve as leads or device connection paths for signals between the encapsulated chip and the memory board, sometimes referred to as a device board (not shown). The number of wire leads is typically much greater than is shown in this example, as the drawing is simplified for reasons of clarity. A memory board for receiving memory chips may be a memory card or any other type of device board to which ICs are mounted. Electronic connectivity between wire leads 10 and circuits within the device board is achieved by soldering the leads directly to connection points (pads) on the device board utilizing surface mounting technology (SMT). Forming of wire leads in chip-package manufacturing, handling, and mounting ICs to device boards often results in yield losses due to damage to or improper connection of wire leads. Moreover, the footprint of a wire-bonded IC is considerably larger than an IC manufactured using BGA techniques.

FIG. 1b is a cross section view of a memory chip package containing two wire bonded memory chips forming a chip stack in a single encapsulated device, much like the package shown in FIG. 1a. In this configuration, the wire bond technology is essentially the same as that shown in FIG. 1a. The difference in FIG. 1b is that two memory chips are vertically stacked and encapsulated within a single chip package 11. Chip package 11 has a higher vertical height, or Z dimension, due to the increased height of the encapsulated chip stack that increases the memory capacity of a given lateral footprint of chip package 11 on a device board (not shown). Memory chip 14 has a smaller X/Y footprint that that for chip 15, to allow for wire bonding, is adhered to the upper surface of chip 15 using standard methods, and has signal paths connecting to the device board through wire leads 12 which are connected to connection points on chip 14 through wires 13, using known wire-bond manufacturing processes. The smaller dimension of the upper chip 14 is necessary in a TSOP pin configuration such as used here, in order to allow chip stacking while still maintaining access to all available connection pads on the larger chip 15. Electronic connection to the device board is provided for chip 15 utilizing wires 16 in a similar manner to that for chip 14.

While not impossible, it is not practical or economic in current art to stack, mount and interconnect chips of identical size utilizing wire bond techniques. Also, stacking chips of different sizes models and functions becomes less practical as availability of preferred chips and combinations may be limited.

However, with the use of chip stacking as described above, all of the above-mentioned problems in manufacture, handling, and assembly using wire-bond technology remain, and indeed, problems such as low-reliability may be exacerbated due to double duty of the wire leads 10. Similarly, leads must be provided in this example to effect surface mounting of chip package 11 to a device board. It can be appreciated in this prior-art example that while maintaining the same X and Y footprint of the device of FIG. 1A, the Z dimension or height of chip package 11 can be considerably more than that of a single-chip package such as chip package 9 of FIG. 1a.

Figure 1C:
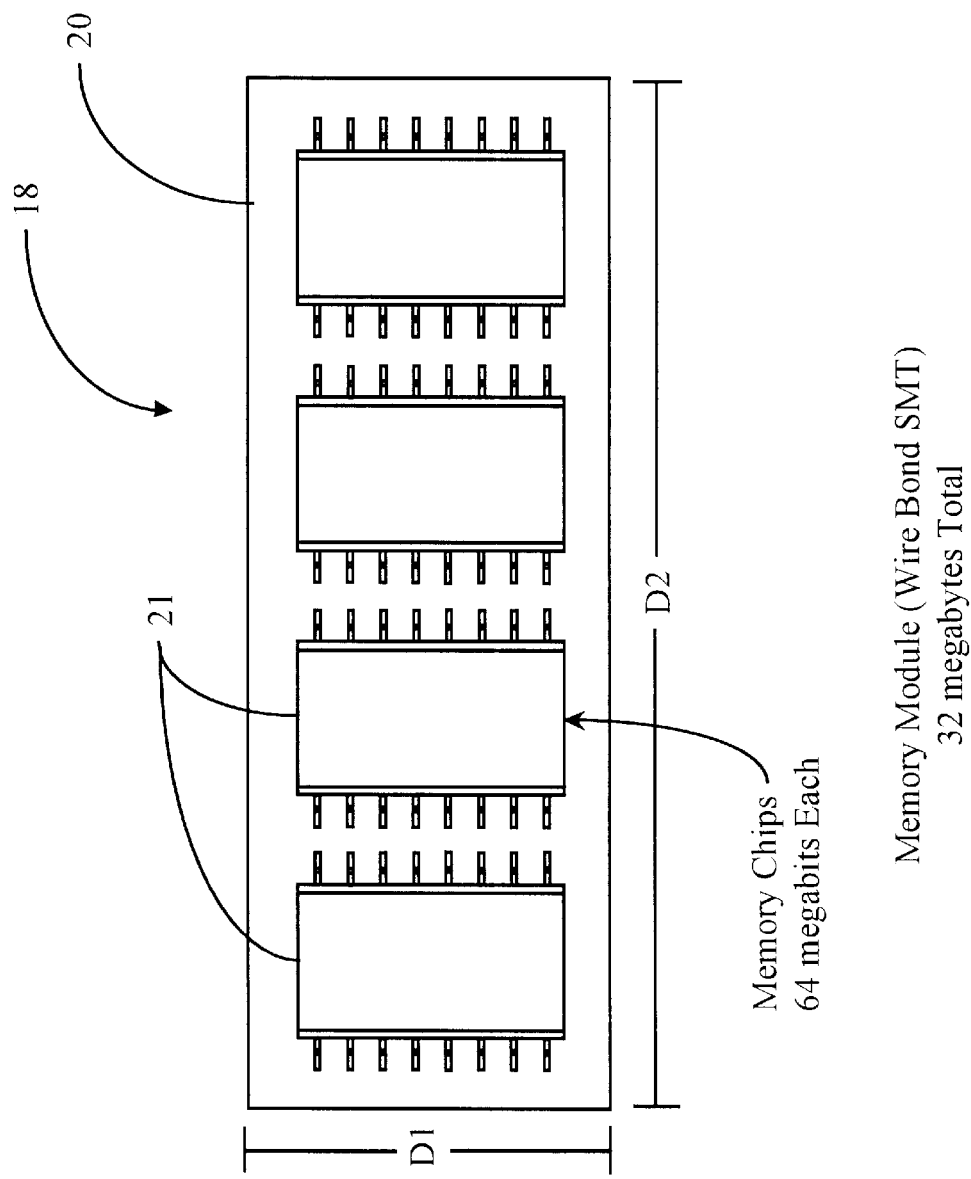
FIG. 1c is a plan view of a device board in the prior art supporting an array of memory chip packages mounted thereon according to prior art.

FIG. 1c is a simplified plan view of a device board supporting an array of memory chip packages 21 mounted thereon according to prior art. Memory module 18 has a standard device board 20 representing a typical circuit board for receiving packaged ICs according to SMT conventions. On device board 20 there are mounted four (4) 64 Megabit DRAM chip packages 21, which collectively provide a memory capacity of 32 Megabytes for device board 20. Total X, Y dimensioning of device board 20 is illustrated herein substantially as dimensions D1 and D2. It will be appreciated in this prior-art example that only 4 memory chips, in this case, DRAMs 21, manufactured according to wire bond technology, may be fitted on one side of board 20 according to the physical constraints of D1 and D2.

Figure 1D:
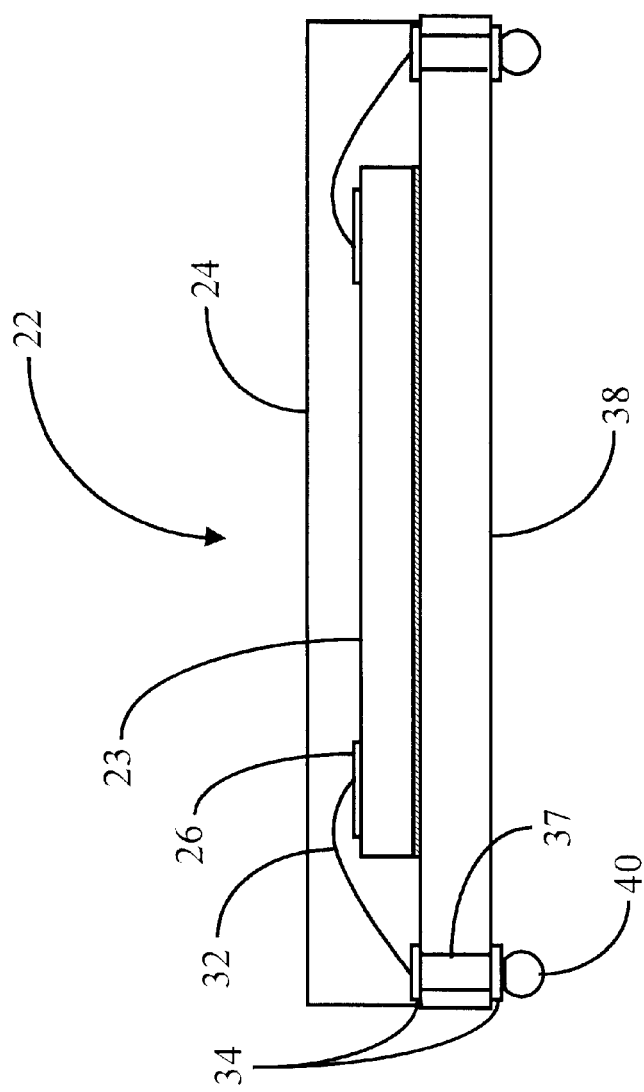
FIG. 1d is a cross-section view of a memory chip package using BGA technology according to prior art.

FIG. 1d is a cross-section view of a memory chip package made for solder-ball mounting to a board according to prior art. In this configuration a conventional DRAM chip package 22 is formed by the encapsulation, again utilizing methods standard in the art, of a DRAM memory chip 23 and in this example, utilizes ball-grid array (BGA) technology for mounting to connections on a memory module printed circuit board. Area-array configurations enabled by (BGA) technology provide advantages over other prior-art methods by allowing for manufacture of much smaller DRAM devices, which can be mounted in greater numbers within the same area occupied by memory devices such as the TSOP devices of FIG. 1c.

Electronic connection between DRAM chip 23 and connections on a memory module printed circuit board (not shown), are provided through wires 32 which are bonded at one end to pads 26 on the DRAM, similarly to the method previously described for FIG. 1b. A board 38 has the purpose, in this example, of supporting DRAM 23, which is adhered to the upper surface, and is of a dimension roughly equal to that of the encapsulation used for chip package 22.

Through-hole connections 37 provide an electronic connection for DRAM 23 to connections on a memory module circuit board, by utilizing through connections 37, each of which have an upper and lower pad 34 metallurgically connected through a conductive filler, such as solder, between them and extending completely through board 38. Solder balls 40 are metallurgically attached to the lower pad 34 and provide electronic connection between through connections 37 and the conductive points on a memory module circuit board.

Figure 1E:
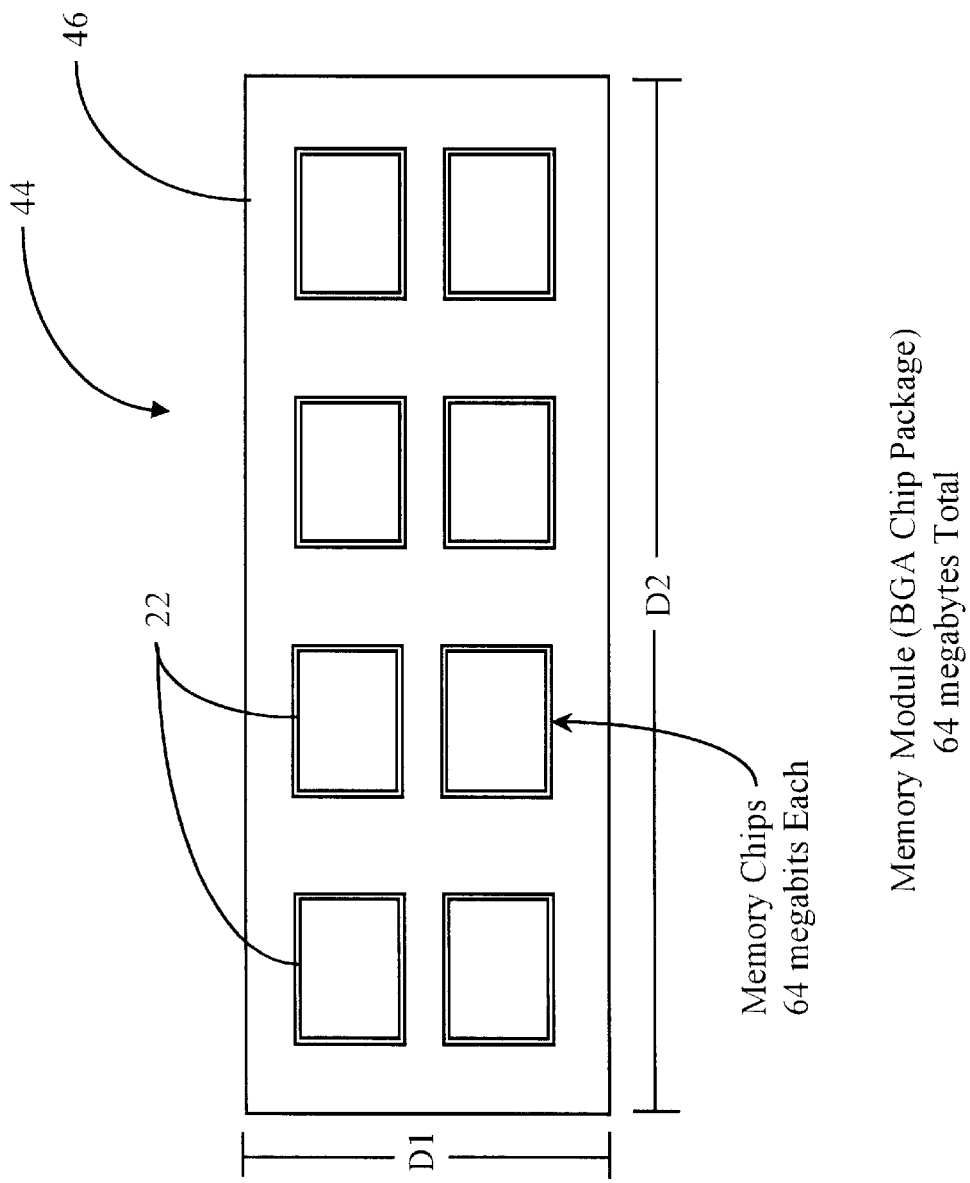
FIG. 1e is a plan view of a device board supporting an array of memory packages using BGA technology mounted thereon.

FIG. 1e is a plan view of a device board supporting an array of memory packages mounted thereon. Memory module 44 in this example has a device board 46 representing a typical circuit board for receiving BGA chip packages 22 of FIG. 1d. On device board 46 there are mounted a total of eight (8) conventional BGA chip packages 22, each chip package 22 having a capacity of 64 megabits of memory and collectively providing a total of 64 megabytes of memory for memory module 44. The X and Y dimensions of device board 46 are illustrated herein substantially as dimensions D1 and D2, and are equal to those of device board 20 of FIG. 1c. It will be appreciated in this example that the collective memory capacity of DRAMs 22 of memory module 44 is greatly increased, effectively doubled in this case, while remaining within the same footprint of dimensions D1 and D2 of device board 46. Problems remain, however, utilizing such current technology, such as the inability to perform a thorough test and burn-in procedure on chip devices at wafer level prior to the encapsulation step, as well as those presented in chip stacking and interconnection of encapsulated devices of the same shape and size, as described previously for prior art.

Turning mow to embodiments of the present invention, FIG. 2a is a perspective view of a memory chip 17 according to an embodiment of the invention, and is the subject of a separate patent application cross-referenced above, and described in greater detail below. The method and apparatus referenced, when compared to practices of conventional BGA technology, provides additional stability to, and increased connectivity between electronic connection points on a memory device and those of a memory module circuit board, assembled according to current BGA technology known to the inventor. In addition, thorough wafer-level testing and burn-in operations are possible utilizing the improved method and apparatus, enabling a practical and economical way for performing such operations prior to wafer separation.

The enhanced BGA method known to the inventor and described in the cross-referenced copending application Ser. No. 09/609,626, involves application of a protective polymer coating that is applied to a silicon wafer substrate using, for example, a spin-application technique, prior to the step of separation of the devices from the wafer. During application the protective polymer coating flows over existing conductive pads to which the conductive leads of the device, in this case solder balls, have been metallurgically attached, completely covering the solder balls and conductive pads. Once cured, the polymer coating material is evenly removed from the surface of the substrate by etching or by a mechanical process, until the upper portions of the covered solder balls become exposed.

In the cross-section of FIG. 2b element 30 represents an IC as conventionally known, having contact pads 28 for electrical connection of devices in the IC to outside circuitry. These are the pads to which wire bonding is conventionally done after ICs are separated from a wafer. In the unique method of the present invention, solder extensions 29 are made to ICs while the ICs are still a part of the wafer, that is, before separation of individual ICs. After the application of extensions 29, as described also above, the polymer coating 25 is applied, then partially removed to expose solder extensions 29.

Once the extensions 29 are exposed, with the polymer coating 25 in place, the enhanced IC (still in the wafer) is much more durable than before. Before this enhancement, extensive wafer-level testing and burn-in could not be done, because pads 28 are too amenable to damage from probes and current used in testing. Extensions 29, being in a preferred embodiment solder columns, are much more tolerant, and if damage is inadvertently done, reflow techniques can be used to correct the damage. Therefore, as a result of the unique enhancement, wafer-level testing and burn in is now possible and practical.

It needs be said at this point that, although extensions 29 are shown in FIG. 2b as extending directly from pads 28, pads 28 are not necessarily located on the wafer at the typical locations, and may not be of the same size as the die attach pads of conventional wafers. A redistribution may well be done, providing conductive traces and new pads on the ICs at wafer level, so the size, material, and location of pads 28 is optimized.

A thorough wafer-level testing and burn-in process may be performed on the devices by utilizing the exposed portions of the solder balls as test leads, and the covered portions of the solder balls are protected and supported by the surrounding cured polymer coating, which provides considerably enhanced lateral strength to the interface between pads 28 and extensions 29.

The IC of FIG. 2a is shown after wafer-level testing and burn-in is complete, ICs have been separated from the original wafer, and balls 19 (shown as 27 in FIG. 2b) have been added. The balls 19 may be added at wafer level or after IC separation.

The solder ball pin-outs of the solder columns and balls 19 are an improvement over wire bonded chips in that the footprint is now the footprint of an individual IC chip. The enhanced chips are also far less susceptible to low yield and damage during manufacture, handling, and assembly, due to the enhanced method of manufacture described above. Also, it may be assumed in this example that the protective coating is present on DRAM 17 protecting underlying contact pads (protective coating not shown), the underlying solder columns, and possibly extending in thickness of material up to the connection points between the solder columns and balls 19. Moreover, DRAM 17 may exhibit only balls 19 without extension solder columns in some examples currently known to the inventor.

Figure 3A:
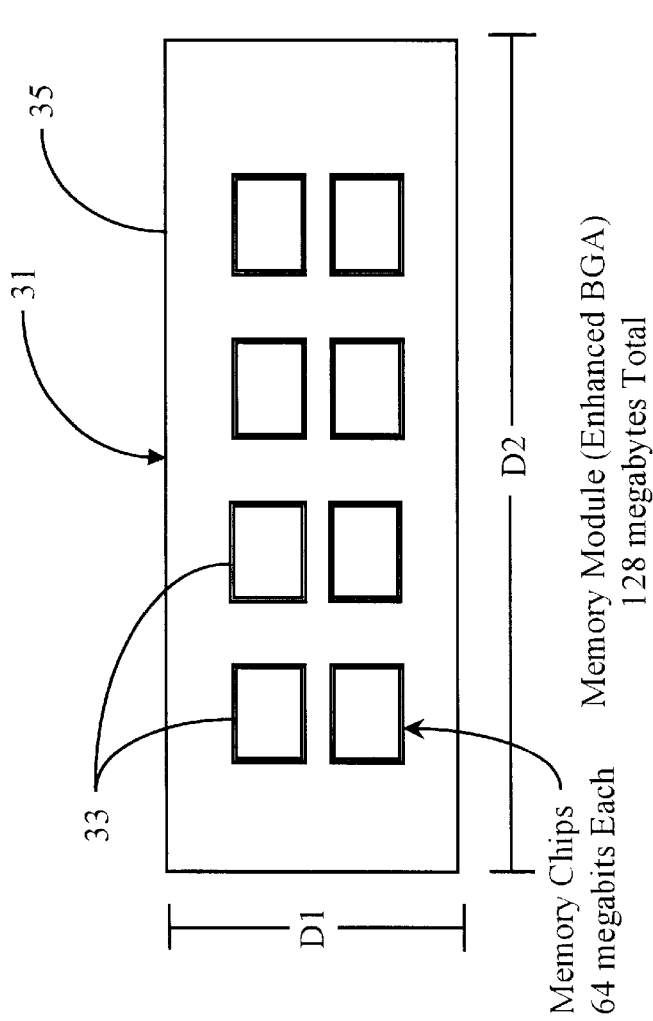
FIG. 3a is a plan view of a device board supporting an array of mounted DRAM memory chips according to current art.
Figure 3B:
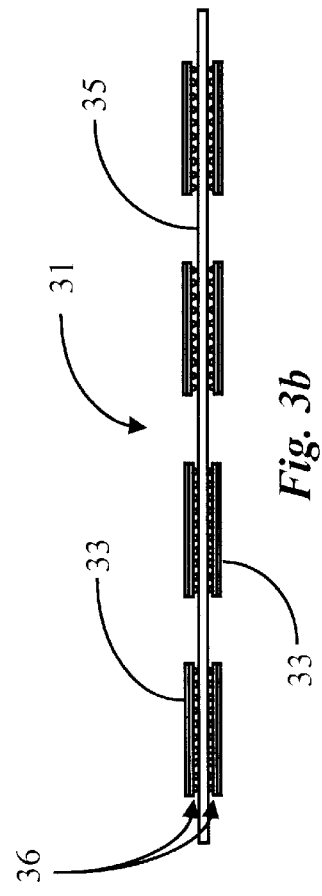

FIGS. 3a and 3b are a plan view and a side view respectively of a device board 35 supporting an array of mounted DRAM memory chips 33 on both sides of the device board. DRAMs 33 are, in this example, analogous to the improved and enhanced DRAMs 17 of FIGS. 2a and 2b, manufactured utilizing the enhanced polymer application method described earlier. In the exemplary diagram of FIG. 3a, a memory module 31 has a device board 35 having X and Y dimensioning substantially represented as dimensions D1 and D2, equal to the dimensions of device boards shown in the previous examples. Memory module 31 has eight (8) 64 Megabit DRAMs 33 illustrated as mounted on each side of device board 35 using ball/solder technology for attachment of chip pin-outs to circuitry paths on the board (not shown) provided and adapted for the purpose. This memory module therefore supports a total of sixteen (16) DRAMs 33, providing a total memory capacity of 128 Megabytes. It will be appreciated that a much greater memory capacity is possible for memory module 31, utilizing the same footprint of device boards of previous examples shown. The footprint and density is achievable through the fact of BGA technology in the art, and the improvement in this example is the improved structure of the chip itself, as described with the aid of FIGS. 2a and 2b above, providing a chip mountable to the board without the necessity of the structure and encapsulation shown in FIG. 1d and described above. Now the footprint of the entity added to the board is exactly the footprint of the IC separated from the wafer, and although the same number of ICs is shown on one side of the board as in FIG. 1e, the footprint is even smaller for each IC, and arrangements may be implemented to add additional ICs to both sides of the board, further enhancing the overall memory capacity.

Taking advantage of the smaller footprint memory module 31 has a memory capacity of 96 Megabytes of total memory, thereby greatly increasing the amount of memory in relation to footprint compared to memory module 18 of FIG. 1c or memory module 44 of FIG. 1e. This increase in memory is accomplished within the effective area described by dimensions D1 and D2, which may be assumed to be the same dimensioning as D1 and D2 of FIG. 1C. It will be appreciated that DRAMs 33 are smaller in size (footprint) than DRAMs 21 of FIG. 1c or DRAMs 22 of FIG. 1e, and may have many more conductive leads by virtue of both miniaturization and strategic array implementation. In side view FIG. 3b the opposing chip arrays comprising DRAMs 33 can be clearly seen mounted on either side of device board 33 with solder connection surfaces 36 facing inward. The main enhancement in this example over prior-art wire-bond ICs is that the footprint of each DRAM 33 is considerably smaller than before, so much so that the total number of DRAMs 33 can be greatly increased within the limitations of D1 and D2, thereby greatly increasing memory capacity of memory module 31. Although memory capacity is more than doubled in this example over that of the example of FIG. 1c, the inventor provides a way to even further increase total memory in such a module through a novel chip-stacking technique and apparatus that is described below.

It is an intention of the inventor in providing the examples above to emphasize the many benefits and capabilities enabled by memory module mounting and interconnection schemes utilizing further embodiments of the present invention, described in enabling detail below.

FIGS. 4a and 4b are a plan view and a side view respectively of a device board supporting an array of mounted DRAM memory chip stacks according to a further embodiment of the present invention. Memory module 41 in this embodiment comprises a device board 43 analogous to device board 35 of FIG. 3a, and also supports a pair of like arrays of DRAMS, in this case DRAMs 45, but with a notable difference being that instead of having a single monolithic DRAM device mounted at each position in the array, two DRAMs 45 are mounted within the same footprint, vertically stacked with one of the two chips flipped for reverse mounting on the opposite surface of a new and novel interconnect unit (interposer) as described further below. In this embodiment, there are a total of (32) 64 Megabit DRAMs 45 stacked (2 chips) high arranged on both sides of device board 43 using the same basic geometric array illustrated in FIG. 3a. The configuration in this embodiment provides 128 Megabytes of memory on each side of device board 43 totaling 256 Megabytes of memory for memory module 41 within essentially the same footprint and volumetric space of the previous memory modules of FIGS. 1c, 1e and 3a.

In this example, both sides of device board 43 are "double stacked" with DRAMs 45. This double-sided aspect, however, is not required in order to practice the present invention. In some embodiments only one side may be double-stacked. The inventor intends only to illustrate that considerable memory increase can be achieved by utilizing both sides of device board 43 for mounting chip stacks. This novel method for stacking DRAMs 45 into chip stacks depends in part on a novel interconnect unit termed an interposer by the inventor, which is illustrated in this example by element number 47 and subsequently shown in greater detail. Each chip stack comprises 2 DRAMs 45 and an interposer 47. Solder balls 48 on either end of each chip stack provide for electronically connecting the circuits of board 43 to those of DRAMs 45 utilizing interposer 47.

In side view FIG. 4b the opposing chip stacks comprising DRAMs 45 can be seen as stacked ball-side to ball-side with interconnect interposer 47 positioned between DRAMs 45. In a preferred embodiment, chip stacks are assembled (in pairs) with an interposer before mounting to device board 43. Interposer 47 is, in a preferred embodiment, of the form of a thin non-conductive BT resin (insulator) having a conductive metal on either or both sides, etched to provide necessary conductive paths, much like a miniature PCB. Interposer 47 is preferably prefabricated for each application after the conductive metal is applied to provide for the circuitry paths required for specific device designs, which will be more clear following description below.

Figure 5:
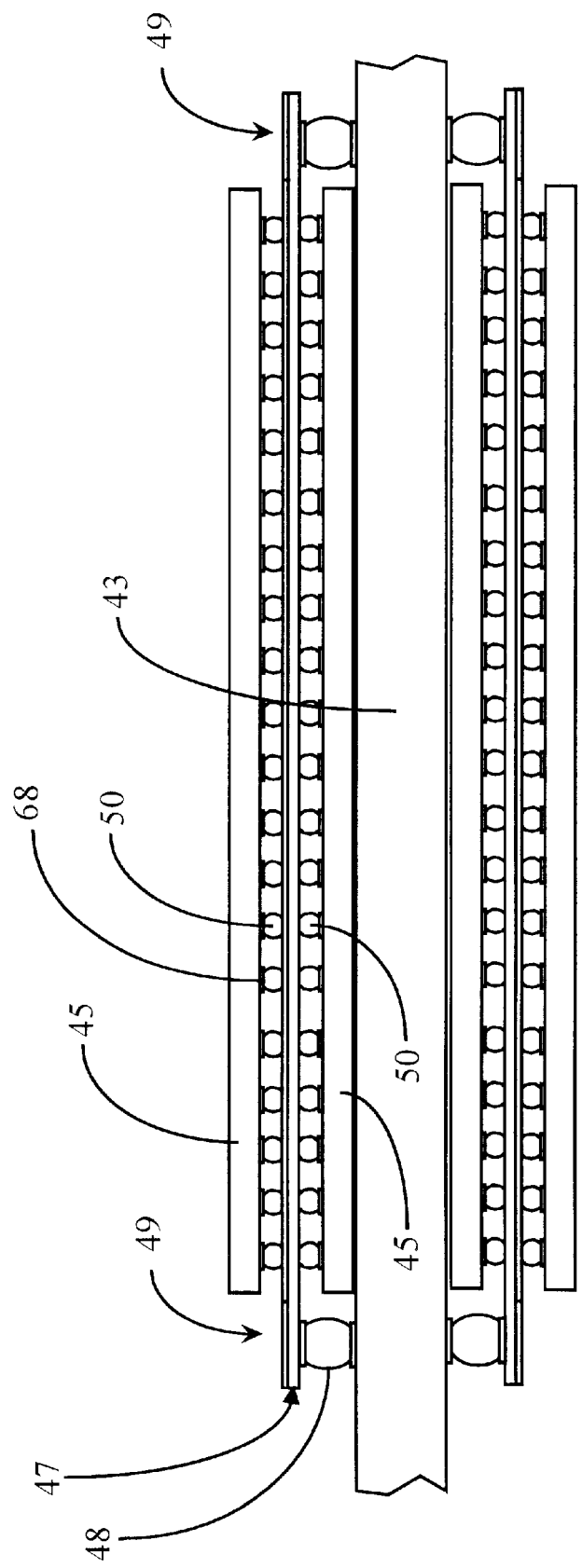
FIG. 5 is a broken enlarged view of a section of the device board of FIG. 4b, expanded to illustrate two mounted chip stack assemblies of FIG. 4b.

FIG. 5 is a broken view, considerably enlarged, of a portion of device memory module 41 of FIG. 4b, expanded to illustrate two stacked DRAMs 45 of FIG. 4b connected to device board 43 both above and below. That is, there are two two-chip stacks, one on each side of PCB 43 in this view. As described with reference to FIG. 4b above, DRAMs 45 are stacked ball-side to ball-side with interposer 47 between DRAMs 45.

It will be apparent to one with skill in the art that a chip stack may contain more than two ICs without departing from the spirit and scope of the present invention. For example, a chip stack comprising 4 ICs may be conceivably assembled using two interposers and extending the bus bar device to the level of the uppermost interposer. In a case of 4 ICs in a chip stack, a second chip stack would be placed on top of the first chip stack in a back-to-back fashion.

An important function of interposer 47 is to electrically connect individual ones of solder balls 50 of both of the chips in a stack to electrical contact pads along the outer periphery (region 49) of the interposer, where connection may then be made to PCB 43 through solder balls 48. This is done in a preferred embodiment by forming electrically conductive traces on a supportive film between pads arranged for contacting balls 50, and pads along edge regions 49 of the interposer, where contact may be completed to PCB 43.

Figure 6A:
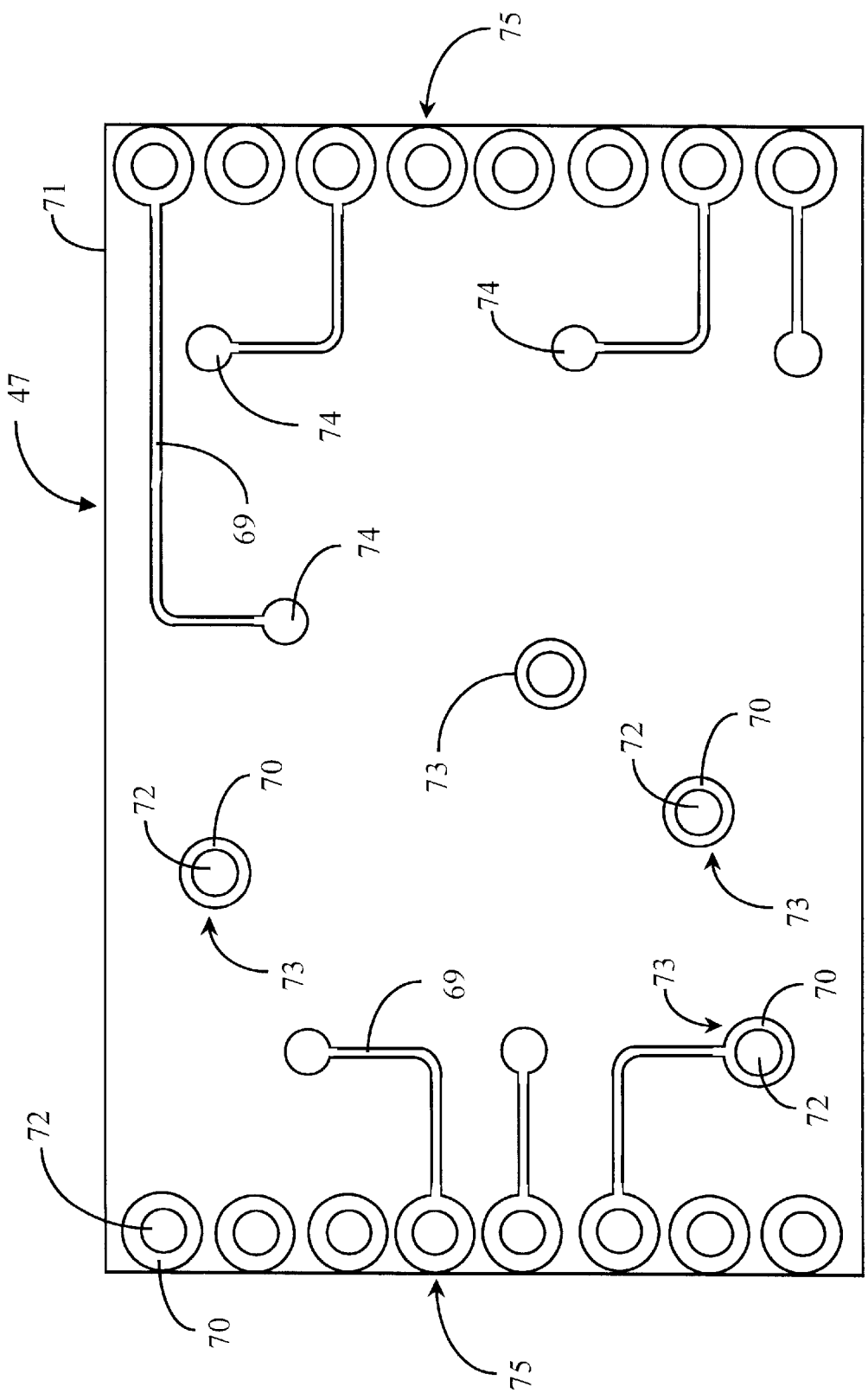
FIG. 6a is an exemplary plan view of an interposer unit from FIG. 5a according to an embodiment of the present invention.
Figure 6B:
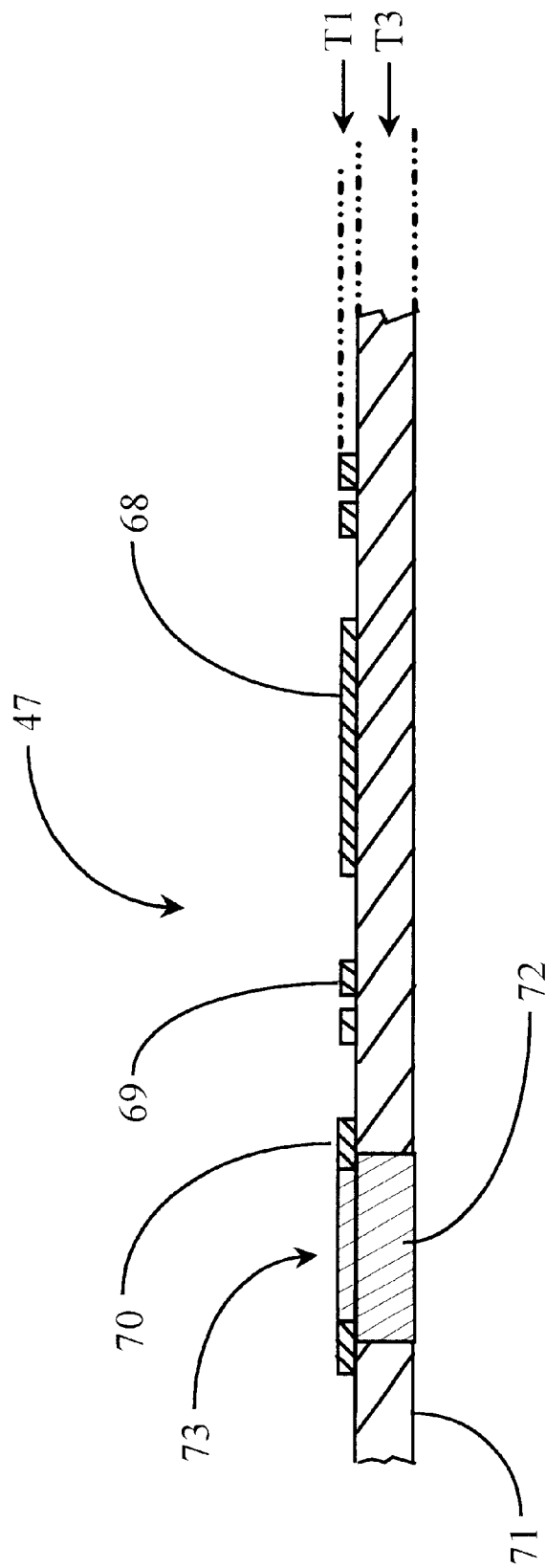
FIG. 6b is a broken cross-section of a portion of the interposer of FIG. 5b, expanded to show greater detail.

FIGS. 6a and 6b are a plan view and a section view respectively of exemplary interposer 47 of FIGS. 4a and 4b. In a preferred embodiment, the interposer base material (the supportive film) is quite thin, such that the interposer panel is itself flexible. In other embodiments the base material may be more substantial and the flat aspect is self-supportive. Additionally there are a variety of ways traces and pads may be formed and implemented on the base material. For example, an electrically conductive film may be applied with an adhesive, or a metal may be sputtered on the base film to create an electrically-conductive layer. Once the electrically-conductive layer is applied, conventional techniques may be used to pattern the film and remove unwanted portions to leave pads and traces where they are wanted. In a preferred embodiment copper is the trace and pad material.

FIG. 6a is a plan view of interposer 47, shown in this view greatly simplified to better illustrate key elements of the new and novel chip device interconnect system provided by the invention. Again, this example is highly simplified to better explain the invention. In FIG. 6a a plurality of conductive pads 73 and 74 are implemented at strategic positions on base material 71. These are for contact with solder balls 50 from one or the other of devices 45, and within the footprint of devices 45, that is, in the area between devices 45. Traces 69 from pads 74 are implemented to provide signal communication to another plurality of contact pads 75 implemented along opposite edges of interposer 47. Pads 75 are positioned such, that when the assembly is made, these pads are in regions 49 outside the footprint of devices 45. In the elevation view of FIG. 5 this is clearly shown. In some cases peripheral pads 75 may be formed along the other edges of base 71 as well, in which case the base is made larger than the device footprint in both directions.

In addition to pads 74 implemented on one side of base 71, there are, in some positions, compound pads 73, which comprise metal rings 70 (such as copper in the case of the conductive traces being made of copper), and holes through base material 71, the holes filled with a conductive material 72, such as solder or a conductive filler. This construction is better understood with reference to FIG. 6b, and is described further below.

Compound pads 73, having conductivity through the base material, allow solder balls or columns 50 on a device 45, which are on the side of interposer 47 away from the conductive traces, to communicate through base material 71. In some cases there is a requirement, for example, for an I/O point on one of devices 45 to communicate with an I/O point on the other device 45, without a signal path being brought out to region 49. If the two points (balls 50) are exactly opposite one another, a compound pad 73 allows this direct communication. If the two or more points (balls 50) are not directly opposite, a combination of a compound pad 73, a trace 69 and a pad 74 may be used (although not explicitly shown in FIG. 6a). Also, in some cases a compound pad 74 may be used with a trace 69 to an edge pad 75, allowing an I/O point of each of devices 45 to simultaneously be connected to an edge pad 75.

Edge pads 75 in a preferred embodiment are structured much like pads 73, having a metal supportive ring 70 and a conductive column 72 through base material 71. The purpose of this construction is to facilitate communication from edge pads 75 to points on a PCB to which a chip stack according to an embodiment of the present invention may be mounted. This connection is best seen with reference to FIG. 6b with description provided below.

FIG. 6b is an exemplary partial cross-section view of interposer 47 of FIG. 6a, taken through one of pads 73, one of pads 68, and several traces 69. As described above, pads and traces are made possible on base material 71 by first forming a conductive layer on the base material, and then selectively removing portions of the conductive layer. The conductive layer in a preferred embodiment is copper. As described above, pads and traces are made possible on base material 71 by first forming a conductive layer on the base material, and then selectively removing portions of the conductive layer. The conductive layer in a preferred embodiment is copper, and is represented in FIG. 6b as thickness T1, while the thickness of the base material is represented by T3. Again, these indications are entirely relative and exemplary.

One pad 73 is shown in FIG. 6b, having a metal ring 70 and a solder fill 72 through a hole in base material 71, the fill extending through a hole in ring 70, such that solder is available from both sides of the interposer 47. In the example shown, pad 73 is free-standing. In some cases such pads a joined to a copper trace as shown in FIG. 6a. Further in FIG. 6b several intersected traces 69 are shown, and a one-side pad 68. The structure of pads 73 in this description is meant as well to be descriptive of pads 75 of FIG. 6a. Copper ring 70 provides some additional structural support for the interposer at the positions where through holes are needed, but in some embodiments there need not be a metal ring, and there will be only a through hole filled with solder of a conductive fill.

Referring again to FIG. 5, at the positions of pads 75 in region 49, there is a conductive path (72 in FIG. 6b) through base material 71. As seen in FIG. 5 at least some of pads 75 mate (through base material 71) with balls 48 which provide communication to points on PCB 43. Thusly, I/O points on devices 45 are brought to connection points on PCB 43.

It will further be apparent to one with skill in the art that the present invention may be practiced in variations of the presented configurations without departing from the spirit and scope of the present invention. The inventor has provided exemplary views for describing at least one embodiment of the present invention. Therefore, the inclusion of illustrated devices, lead designs, described processes, and materials in this example should not be construed as a limitation in any way to the practice of the present invention. Furthermore, the functionality described herein, although illustrated primarily with reference to memory modules should be recognized as applicable also to various types of IC chips and circuitry beyond that of memory modules. Therefore, the method and apparatus of the present invention should be afforded the broadest possible scope under examination. The spirit and scope of the present invention is limited only by the claims that follow.

What is claimed is:

1. An IC package for mounting to a surface of a device board comprising:
   a first IC having a first surface supporting a first plurality of conductive leads extending orthogonally from the first surface;
   a second IC having a second surface supporting a second plurality of conductive leads extending orthogonally from the second surface, the first and second ICs spaced apart in parallel with the first and second surfaces facing; and
   an interposer trace board parallel to the first and second ICs and positioned between the first and second ICs, the trace board having conducting metal traces on a non-conductive sheet material on opposite sides of the trace board, the traces accessible from the opposing sides of the trace board, being exposed at selected regions through the non-conductive sheet;
   characterized in that the conductive traces provide direct contact to individual ones of the first and second pluralities of conductive leads, providing conductive signal paths from the first and second ICs between the ICs and leading to edges of the IC package.

2. The IC package of claim 1, wherein the ICs are memory chips and the device board is a memory board.

3. The IC package of claim 1, wherein the conductive leads of the first and second ICs in the package are solder balls.

4. The IC package of claim 3, wherein the solder balls are supported by solder columns extending through a non-conductive polymer layer on individual ICs.

5. The IC package of claim 1, wherein, regarding the interposer board, the conductive metal traces are formed in a copper foil joined to the non-conductive sheet material by adhesive.

6. The IC package of claim 1, wherein, regarding the interposer board, the conductive metal traces are formed in a metal material deposited on the non-conductive sheet using a metal deposition technology.

7. The IC package of claim 6 wherein the deposition technology is one of a spin-on, sputtering, or evaporation technology.

8. A memory module for providing memory resources to a computerized appliance comprising:
a printed circuit board (PCB) having at least one location for mounting an IC module;
at least one IC module mounted to the circuit board, the module comprising a first IC having a first surface supporting a first plurality of conductive leads extending orthogonally from the first surface, a second IC having a second surface supporting a second plurality of conductive leads extending orthogonally from the second surface, the first and second ICs spaced apart in parallel with the first and second surfaces facing, and an interposer trace board parallel to the first and second ICs and positioned between the first and second ICs, the trace board having conducting metal traces on a non-conductive sheet material, the traces accessible from both sides of the trace board, being exposed at selected regions through the non-conductive sheet, characterized in that the conductive traces contact individual ones of the first and second pluralities of conductive leads, providing conductive signal paths from the first and second ICs between the ICs, and leading to edges of the IC package; and
a bus-bar facility positioned along at least one edge of the IC module, providing conductive paths from the traces of the interposer board to selected regions of the PCB.

9. The memory module of claim 8, wherein the ICs are memory chips.

10. The memory module of claim 8, wherein the conductive leads of the first and second ICs are solder balls.

11. The memory module of claim 10, wherein the solder balls are supported by solder columns extending through a non-conductive polymer layer on the individual ICs.

12. The memory module of claim 8, wherein, regarding the interposer board, the conductive metal traces are formed in a copper foil joined to the non-conductive sheet material by adhesive.

13. The memory module of claim 8, wherein, regarding the interposer board, the conductive metal traces are formed in a metal material deposited on the non-conductive sheet using a metal-deposition technology.

14. The memory module of claim 13 wherein the deposition technology is one of a spin-on, sputtering, or evaporation technology.

15. The memory module of claim 8, wherein there are a plurality of IC packages mounted to both sides of the circuit board of the module.

16. An interposing contact element for providing conductive and nonconductive interface between opposing leads of two ICs stacked in a packaged IC assembly comprising:
a non-conductive sheet; and
metal contact pads and traces formed on opposite sides of the non-conductive sheet, including openings through the non-conductive sheet to expose regions of conductive contact pads or traces;
characterized in that the contact pads and traces are placed on opposite sides of the nonconductive sheet to match a pattern of the opposing leads of the two ICs.

17. The interposing contact element of claim 16, wherein the conductive traces and contact pads are formed from a copper foil applied to the non-conductive sheet by an adhesive.

18. The interposing contact element of claim 16, wherein the metal contact pads and traces are formed in a metallic film layer deposited on the interfacing material using one of a deposition, spin-on, or sputtering technology.

19. The interposing contact element of claim 16, wherein the non-conductive sheet is formed from a BT resin.

* * * * *